(12) United States Patent
Bilhe et al.

(10) Patent No.: US 10,941,083 B2
(45) Date of Patent: Mar. 9, 2021

(54) PART COATED WITH A COATING FOR PROTECTION AGAINST CMAS

(71) Applicant: SAFRAN AIRCRAFT ENGINES, Paris (FR)

(72) Inventors: Pascal Fabrice Bilhe, Le Coudray Montceaux (FR); André Hubert Louis Malie, Chatellerault (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 461 days.

(21) Appl. No.: 15/741,857

(22) PCT Filed: Jul. 8, 2016

(86) PCT No.: PCT/FR2016/051750
§ 371 (c)(1),
(2) Date: Jan. 4, 2018

(87) PCT Pub. No.: WO2017/006069
PCT Pub. Date: Jan. 12, 2017

(65) Prior Publication Data
US 2018/0274081 A1 Sep. 27, 2018

(30) Foreign Application Priority Data
Jul. 8, 2015 (FR) ........................ 1556457

(51) Int. Cl.
*C04B 41/52* (2006.01)
*C04B 41/89* (2006.01)
(Continued)

(52) U.S. Cl.
CPC .......... *C04B 41/526* (2013.01); *C04B 35/195* (2013.01); *C04B 41/52* (2013.01);
(Continued)

(58) Field of Classification Search
CPC ..... C04B 41/52; C04B 41/522; C04B 41/524; C04B 41/89; C04B 35/195; C04B 41/526;
(Continued)

(56) References Cited

U.S. PATENT DOCUMENTS 6,294,261 B1    9/2001  Sangeeta et al.
6,352,790 B1 *  3/2002  Eaton ................ C04B 41/009
                                                        428/446
(Continued)

FOREIGN PATENT DOCUMENTS

EP      0629714 A1 * 12/1994  ............. C22C 38/60
EP      0629714 B1 *  4/2000  ............. C22C 38/60
(Continued)

OTHER PUBLICATIONS

International Search Report as issued in International Patent Application No. PCT/FR2016/051750, dated Sep. 23, 2016.
(Continued)

*Primary Examiner* — Z. Jim Yang
(74) *Attorney, Agent, or Firm* — Pillsbury Winthrop Shaw Pittman LLP

(57) ABSTRACT

A part coated in a protective coating forms a thermal barrier and includes a ceramic first layer. The protective coating further includes a second layer present on the first layer and including a majority by weight of a first feldspar mineral having a melting temperature higher than or equal to 1010° C. and presenting a thickness greater than or equal to 10 µm.

9 Claims, 1 Drawing Sheet

(51) Int. Cl.
  *C04B 35/195* (2006.01)
  *C23C 28/04* (2006.01)
  *C23C 4/129* (2016.01)
  *C23C 4/134* (2016.01)
  *C23C 30/00* (2006.01)
  *F01D 5/28* (2006.01)
  *C23C 14/08* (2006.01)

(52) U.S. Cl.
  CPC .............. *C04B 41/89* (2013.01); *C23C 4/129* (2016.01); *C23C 4/134* (2016.01); *C23C 14/08* (2013.01); *C23C 28/042* (2013.01); *C23C 30/00* (2013.01); *C23C 30/005* (2013.01); *F01D 5/288* (2013.01); *F05D 2230/90* (2013.01)

(58) Field of Classification Search
  CPC ..... B32B 18/00; F01D 5/288; F05D 2230/90; F05D 2230/611; F05D 2230/6111
  See application file for complete search history.

(56) References Cited

U.S. PATENT DOCUMENTS

| | | | |
|---|---|---|---|
| 2006/0211241 A1 | 9/2006 | Govern et al. | |
| 2006/0280963 A1 | 12/2006 | Hazel et al. | |
| 2007/0119713 A1* | 5/2007 | Hasz | C25D 7/10 204/490 |
| 2010/0255260 A1* | 10/2010 | Lee | C04B 41/52 428/164 |
| 2010/0255289 A1* | 10/2010 | Lewinsohn | C04B 41/52 428/325 |
| 2012/0034491 A1* | 2/2012 | Hongoh | C23C 28/3455 428/697 |
| 2012/0063912 A1 | 3/2012 | Bouillon et al. | |
| 2012/0167573 A1* | 7/2012 | Belousov | C23C 28/3215 60/752 |
| 2013/0136915 A1* | 5/2013 | Naik | C04B 41/009 428/312.6 |
| 2014/0065438 A1* | 3/2014 | Lee | C23C 28/3215 428/623 |
| 2014/0072816 A1* | 3/2014 | Lee | C04B 41/009 428/448 |
| 2014/0261080 A1* | 9/2014 | Lee | C04B 41/52 106/286.5 |
| 2014/0272467 A1* | 9/2014 | Schaeffer | F01D 25/08 428/697 |
| 2015/0014179 A1* | 1/2015 | Doebber | C23C 28/042 205/333 |
| 2015/0086796 A1* | 3/2015 | Juez Lorenzo | B32B 5/16 428/450 |
| 2016/0186580 A1* | 6/2016 | Zaleski | C23C 4/127 428/332 |
| 2016/0257618 A1* | 9/2016 | Jordan | C01F 17/34 |
| 2016/0332922 A1* | 11/2016 | Tang | C04B 41/5035 |
| 2017/0226621 A1* | 8/2017 | Doebber | C23C 4/11 |
| 2018/0086672 A1* | 3/2018 | Hill | C23C 28/345 |
| 2019/0048475 A1* | 2/2019 | Ndamka | C23C 28/347 |

FOREIGN PATENT DOCUMENTS

| | | |
|---|---|---|
| EP | 2 236 650 A1 | 10/2010 |
| EP | 2 631 321 A1 | 8/2013 |
| EP | 2 778 147 A2 | 9/2014 |
| JP | 2001-226759 A | 8/2001 |
| JP | 2006-264311 A | 10/2006 |
| RU | 2523265 C2 | 7/2014 |

OTHER PUBLICATIONS

Office Action as issued in Japanese Patent Application No. 2018-500575, dated Aug. 25, 2020.

* cited by examiner

PART COATED WITH A COATING FOR PROTECTION AGAINST CMAS

CROSS REFERENCE TO RELATED APPLICATIONS

This application is the U.S. National Stage of PCT/FR2016/051750 filed Jul. 8, 2016, which in turn claims priority to French Application No. 1556457 filed Jul. 8, 2015. The contents of both applications are incorporated herein by reference in their entirety.

BACKGROUND OF THE INVENTION

The present invention relates to the general field of coatings forming a thermal barrier used for thermally insulating metallic parts in high temperature environments. The invention applies more particularly, but not exclusively, to the thermal barriers used to protect superalloy parts in aviation gas turbines.

The parts present in the hot portions of aviation turbine engines operating in desert regions, or in regions that are very polluted, become degraded very quickly as a result of being attacked by sand and by alkaline components present in the air that is ingested by the engine. Such compounds are known as "CMAS" (covering in particular the oxides of calcium, magnesium, aluminum, and silicon) and they can degrade the coating acting as a thermal barrier and covering certain parts in the hot portions of the turbine engine.

Among the mechanisms whereby the thermal barrier is degraded by CMAS compounds, there exist in particular both infiltration of CMAS compounds in the liquid state into the thermal barrier, and also dissolution-reprecipitation of the thermal barrier (conventionally constituted by a ceramic based on yttrium-stabilized zirconia (YSZ)), in the form of isolated zirconia nodules that are depleted in yttria. These two mechanisms reduce the mechanical properties of the thermal barrier and can lead to it cracking during stages of the engine cooling. Furthermore, ingesting solid particles leads to phenomena whereby the thermal barrier is eroded and spalls, then leaving the underlying metallic substrate bare, and thus reducing the lifetime of the parts.

Solutions exist for limiting the infiltration of CMAS into the thermal barrier. By way of example, mention may be made of using a coating that protects the thermal barrier and that is based on gadolinium-doped zirconia (e.g. known as gadolinium zirconate), or indeed using alumina or titanium oxide. Those coatings, when they react with CMAS, encourage precipitation of the CMAS and thus serve to limit penetration into the thermal barrier. Nevertheless, those coatings present the drawback of being sacrificial, which requires continuous maintenance, and also continuous monitoring of the state of parts. Furthermore, the availability of chemical elements (in particular of rare earths) that are present in those coatings is becoming more and more limited, which constitutes an additional constraint on using them.

There therefore exists a need to have a part that is coated in a protective coating that forms a thermal barrier and that presents a long lifetime in the environments and operating conditions of an aviation turbine engine.

OBJECT AND SUMMARY OF THE INVENTION

A main object of the present invention is thus to mitigate such drawbacks by proposing a coated part comprising a metallic and/or intermetallic substrate and a protective coating forming a thermal barrier covering said substrate, the protective coating comprising a ceramic first layer and the part being characterized in that the protective coating further comprises a second layer present on the first layer, the second layer comprising a majority by weight of a first feldspar mineral having a melting temperature higher than or equal to 1010° C. and presenting a thickness greater than or equal to 10 micrometers (µm).

The term "covered" is used to mean that the substrate of the part is covered over all or part of its surface that is accessible or that needs to be protected thermally.

The coating of the coated part of the invention is remarkable firstly in that it comprises an outer layer that is impermeable to CMAS, or in other words that is proof against CMAS. Specifically, the second layer retains a solid form at high temperature and prevents liquid CMAS from penetrating into the underlying ceramic first layer (which constitutes the thermally insulating layer of the coating). The term "high temperature" is used to designate temperatures of the order of 1000° C., as can occur in an aviation turbine engine in operation.

Such a layer is no longer a sacrificial layer as in prior art coatings, in particular because it conserves a solid form at high temperature. The term "sacrificial" is used to mean that, as soon as it has been made, the layer deposited in this way presents the capacity for being chemically compatible with CMAS (because it has a composition that is chemically close). The lifetime of such a layer is thus increased compared with prior art coatings.

In addition, the mineral of the second layer is chemically stable with silica and alumina, which are compounds present in CMAS and other sands or cements that might be ingested by the turbine engine. Specifically, feldspars (or minerals of the feldspar family) are aluminosilicates that present a majority phase of silica. Furthermore, these minerals are compatible with the presence of water with which they degrade via a decomposition reaction that is very slow.

The composition of the ceramic first layer is not modified by adding the second layer, which is independent of the first (in particular they may be deposited independently one on the other). Thus, the performance of the ceramic first layer is not degraded by the presence of the protective second layer, nor by its method of deposition.

The thickness greater than or equal to 10 µm of the second layer serves to improve firstly its ability to withstand CMAS, and also the ability of the coating to withstand erosion and impacts. The coated part of the invention thus has a second coating layer of thickness that is controlled and sufficient for obtaining the above-mentioned advantages. This is not true, for example, with coatings having a protective layer that is formed within a turbine engine in operation, e.g. as a result of a chemical reaction involving a thermal barrier layer and CMAS. Specifically, a protective layer that is formed in situ in the turbine engine, as contrasted to being formed before first use in the turbine engine, may present a thickness that is smaller, that is not controlled, and that is non-uniform over the part, since it depends in particular on CMAS diffusing into the thermal barrier and on environmental conditions (temperature, composition of the CMAS) that vary within the turbine engine.

Finally, the second layer of the coating of the invention also makes it possible to plug macropores that may be present in the surface of the ceramic first layer. For example, when the ceramic first layer comprises yttria-stabilized zirconia, it presents a lamellar structure or a rod (column) structure with non-zero surface roughness, and it thus becomes advantageous to put a protective layer into place that is capable of covering and plugging its surface pores.

In an embodiment, the second layer of the coating presents thickness that is greater than or equal to 20 µm, e.g. greater than or equal to 50 µm.

In an embodiment, the second layer of the coating presents thickness that is greater than or equal to one-third of the thickness of the first layer.

In an embodiment, the second layer presents a degree of crystallinity that is greater than or equal to 5%, e.g. greater than or equal to 10%. This degree of crystallinity can be measured in conventional manner using techniques such as X-ray diffraction or Raman spectroscopy. The crystallinity of the second layer serves in particular to improve adhesion between the first layer and the second layer of the coating.

Preferably, the ceramic first layer comprises zirconia.

Also preferably, the ceramic first layer comprises yttrium-stabilized zirconia. In a variant, the ceramic first layer may also comprise zirconia doped with rare earths or with a composition based on ternary oxides. In the family of ternary systems, mention may be made by way of example of systems based on yttria-stabilized zirconia doped with a distinct third oxide such as an oxide of one of the following chemical elements: ytterbium (Yb); neodymium (Nd); dysprosium (Dy); gadolinium (Gd); niobium (Nb); tantalum (Ta); and samarium (Sm).

In an embodiment, the second layer comprises a majority by weight of anorthite. The term "anorthite" is used to designate feldspar minerals having a general composition $CaAl_2Si_2O_8$, which includes polymorphic minerals of anorthite.

Anorthite presents the advantage of having a high melting temperature (higher than 1500° C.), its melting being congruent (i.e. the solid/liquid phase change takes place without changing its chemical composition, and without disassociation into secondary compounds). Anorthite is also very stable and decomposes very little under the pressure and temperature conditions that are imposed, e.g. in an aviation turbine engine. In addition, anorthite presents low density (making it possible to reduce the centrifugal mechanical forces on rotating parts, in comparison with coatings that are denser), a coefficient of thermal expansion that is close to that of the superalloy, and thermal conductivity comparable to that of the insulating ceramic of the first layer of the coating (the thermal conductivity of anorthite is of the order of 2 watts per meter per kelvin ($W.m^{-1}.K^{-1}$)). Finally, anorthite is easy to use since several methods are known for synthesizing and depositing anorthite (e.g.: sol-gel, slurry, chemical vapor deposition, spraying, thermal spraying, etc.).

In certain embodiments, the coating further comprises a third layer comprising a majority by weight of a second feldspar mineral having a melting temperature greater than or equal to 1010° C., the third layer being situated under the first layer. This deposit adds additional protection to the substrate if the ceramic first layer becomes degraded and allows molten CMAS to pass through towards the underlying layer. Such deposition is possible since the material forming the second layer has an alumina phase, thus making it compatible with the underlying bonding layer (generally arranged between the substrate and the ceramic first layer), which is often rich in aluminum so as to have an aluminum-forming character.

In certain embodiments, the protective coating further comprises a fourth layer covering the second layer and comprising alumina and/or titanium oxide. Alumina and titanium oxide ($TiO_2$) are nucleating agents that serve to cause molten CMAS to precipitate before reaching the underlying layers of the coating.

Furthermore, the second layer may also further comprise alumina and/or titanium oxide, for the same reasons as above. Alumina and/or titanium oxide may be deposited at the same time as the feldspar is being deposited, such that the second layer has phases of alumina and/or titanium oxide dispersed in a majority feldspar phase.

A coated part of the invention may be a part for an aviation turbine engine, e.g.: a turbine blade, a turbine nozzle, a turbine vane, a turbine ring, a combustion chamber, a kerosene ejection nozzle, etc.

The invention also provides a method of fabricating a coated part comprising a metallic and/or intermetallic substrate and a protective coating forming a thermal barrier covering said substrate, the method comprising forming a ceramic first layer on the metallic and/or intermetallic substrate, and being characterized in that it further comprises forming a second layer on the ceramic first layer, the second layer comprising a majority by weight of a feldspar mineral having a melting temperature higher than or equal to 1010° C. and presenting a thickness greater than or equal to 10 µm.

The method of the invention for fabricating the coated part may be performed prior to a first use of the part in a turbine engine. In other words, the coating may be formed on the coated part of the invention prior to first use of the part in an engine. As a result, the protective coating of the part of the invention can be uniform in composition and in thickness over the entire part, independently of subsequent conditions of use of the part.

Finally, the invention provides a method of using a coated part as defined above, the method comprising using the part in an oxidizing environment at a temperature higher than 1000° C. and in the presence of aluminosilicates of calcium and of magnesium (CMAS). These conditions may correspond to the conditions that are to be encountered in a turbine engine in operation.

BRIEF DESCRIPTION OF THE DRAWING

Other characteristics and advantages of the present invention appear from the following description given with reference to the accompanying drawing, which shows embodiments having no limiting character. In the figures.

DETAILED DESCRIPTION OF THE INVENTION

Figure 1:
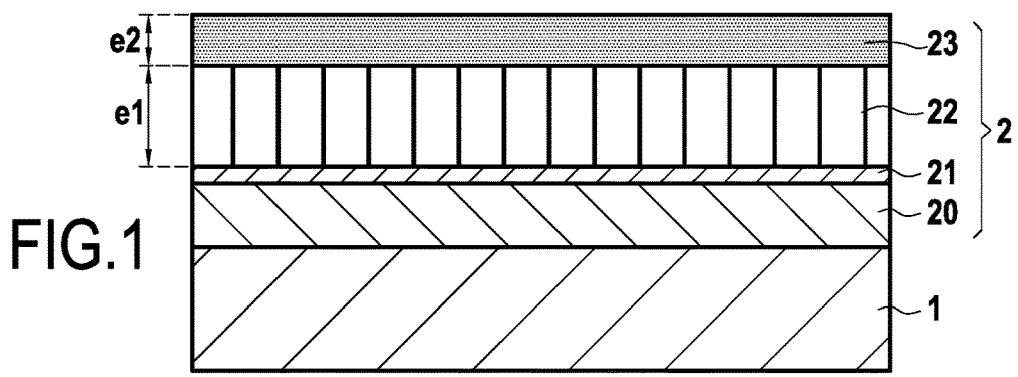
FIGS. 1 to 4 show various parts comprising substrates covered in a protective coating forming a thermal barrier in various embodiments of the invention.

FIG. 1 is a section view of a protective coating 2 forming a thermal barrier on a metallic (and/or intermetallic) substrate 1 of a coated part of the invention. By way of example, the part may be a turbine blade of an aviation turbine engine. Typically, the substrate 1 may comprise a superalloy based on iron, cobalt, or nickel. It should be observed that the substrate 1 may also comprise an intermetallic material of the type comprising titanium aluminides, or indeed niobium silicides, molybdenum silicides, etc. The coating 2 covers the substrate 1 and is directly in contact therewith.

In known manner, the coating 2 comprises firstly a bonding layer 20 that serves to provide protection against corrosion and oxidation of the substrate 1. This known bonding layer 20 becomes partially oxidized at its surface and down to a certain depth when it is raised to high temperature so as to form an oxide layer 21 that may be referred to as "thermally grown oxide" (TGO). By way of example, the bonding layer 20 may comprise an aluminide that is simple or modified.

Thereafter, a ceramic first layer 22 covers the oxide layer 21. In this example, the first layer 22 is directly in contact with the oxide layer 21, which acts as an attachment underlayer for the first layer 22.

Typically, this first layer 22 may comprise yttria-stabilized zirconia (YSZ) having a structure in the form of rods or columns. The first layer 22 may present non-zero roughness on its outer surface (i.e. its surface remote from the substrate 1). The first layer 22 provides the thermal insulation of the coating 2 forming a thermal barrier and protecting the substrate 1 from the heat of gas in the gas flow passage through the turbine engine. It is also this first layer 22 that can be degraded by the action of CMAS at high temperature. The coating 2 of the coated part of the invention serves to limit this degradation.

In a variant, the first layer 22 may comprise zirconia doped with rare earths, or with a composition based on ternary oxides. By way of example, in the family of ternary systems, mention may be made of systems based on yttria-stabilized zirconia doped with a distinct third oxide such as an oxide of one of the following chemical elements: ytterbium (Yb), neodymium (Nd), dysprosium (Dy), gadolinium (Gd), niobium (Nb), tantalum (Ta), samarium (Sm).

In accordance with the invention, the coating 2 also has a second layer 23 comprising a majority by weight of a feldspar mineral having a melting temperature higher than or equal to 1010° C. This layer presents a thickness e2 that is greater than or equal to 10 µm, e.g. greater than 20 µm, or even greater than or equal to 50 µm. The thickness e2 of the second layer 23 may be greater than or equal to one-third of the thickness e1 of the first layer 22.

The second layer 23 or protective layer 23 serves to protect the ceramic first layer 22, in particular by forming a barrier that is proof against CMAS, and that is chemically compatible with CMAS. Specifically, minerals of the feldspar family having a melting temperature higher than 1010° C. are firstly solid at the high temperatures to which they are exposed in the turbine engine. Furthermore, they have a chemical structure based on alumina and silica in the majority phase, which gives them good chemical compatibility with CMAS in the environment of the turbine engine. By way of example, such a mineral may be anorthite, or one of its polymorphs.

To summarize, the coating 2 comprises, going from the layer closest to the substrate 1 to the layer furthest away: a bonding layer 20 directly in contact with the substrate 1; an oxide layer 21 directly in contact with the bonding layer 20; a ceramic first layer 22 directly in contact with the oxide layer 21; and a protective second layer 23 directly in contact with the ceramic first layer 22.

Figure 2:
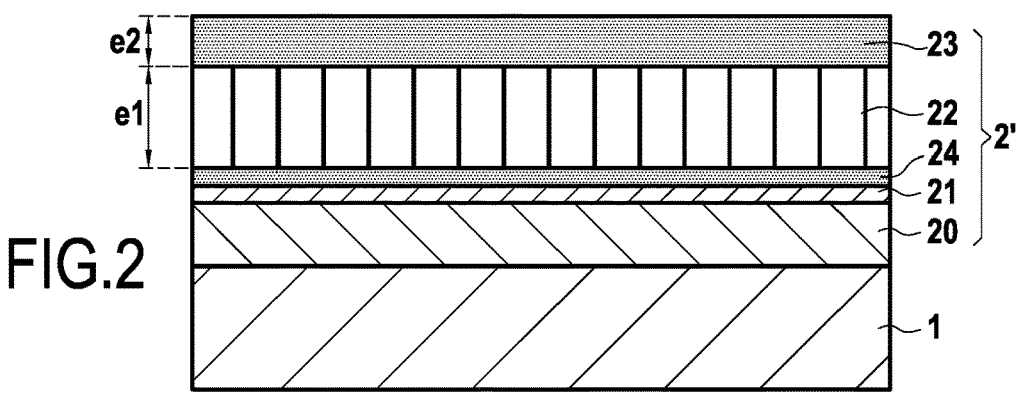

FIG. 2 shows another embodiment of a part comprising a substrate 1 covered in a coating 2' of the invention. In this example, the coating 2' also comprises a protective third layer 24 covering the oxide layer 21 and arranged below the ceramic first layer 22. In this example, the protective third layer 24 is directly in contact with the oxide layer 21 and the ceramic first layer 22.

This configuration is advantageous in that it makes it possible to have another CMAS-proof layer 24 or CMAS-proof third layer 24 under the ceramic first layer 22 and serving, in the event that CMAS passes through the layer 22, to prevent the CMAS from reaching the substrate 1 and degrading it. The third layer 24 presents a composition of the same type as the second layer 23, and may comprise a majority by weight of a second feldspar mineral having a melting temperature higher than or equal to 1010° C. The second feldspar mineral may be identical to the first mineral of the second layer 23, or it may be different therefrom.

Such a configuration is not possible with prior art protective layers since those layers are generally not compatible with the material of the oxide layer 21. By way of example, a prior art protective layer based on gadolinium-doped zirconia becomes degraded by reacting with alumina and forming gadolinium aluminide. Forming such gadolinium aluminide leads to an increase in volume and also to the formation of pores, thereby considerably weakening the coating as a whole. The third layer 24 of the invention is compatible with the alumina of the oxide layer 21 since it includes in particular an alumina phase.

Figure 3:
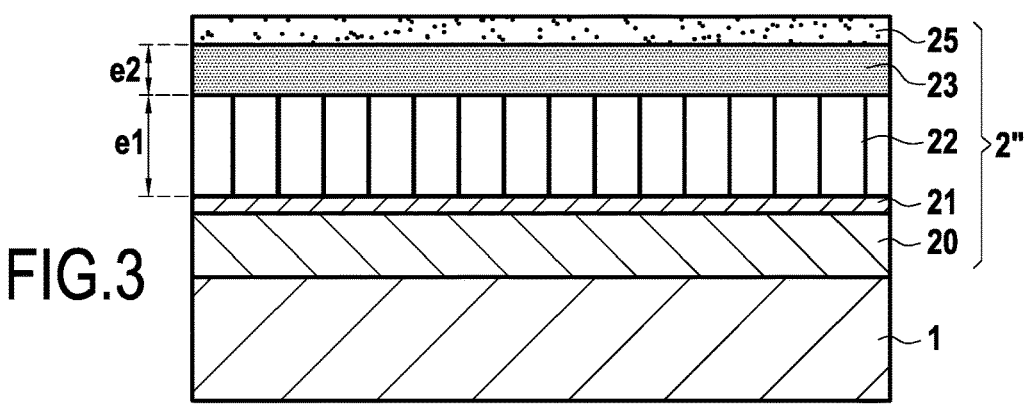

The coating 2" of FIG. 3 comprises a fourth layer 25 covering the protective second layer 23 for the purpose of further increasing the protection of the ceramic layer 22. This fourth layer 25 in contact with the second layer 23 comprises alumina and/or titanium oxide. Alumina and titanium oxide are compounds that can react with liquid CMAS and encourage it to precipitate. It should be observed that it is also possible for the fourth layer 25 to use oxides of rare earths, e.g. an oxide of yttrium, zirconium, gadolinium, lanthanum, samarium, etc. Thus, with such an additional layer, the lifetime of the coating 2" is further increased.

In a variant, it is possible to add alumina and/or titanium oxide in the protective second layer 26 (as in the coating 2''' of FIG. 4), in order to increase the effectiveness of the protection of the coating. For example, alumina and/or titanium oxide may be added in the form of powder while depositing the protective second layer.

EXAMPLE

In the following examples, attention is given to using anorthite as the feldspar mineral of the second layer 23 or of the protective third layer 24, and also to a method of depositing it.

Anorthite, of general formula $CaAl_2Si_2O_8$ presents additional advantages over other feldspars, in particular a congruent melting point at higher than 1500° C., thereby giving it greater chemical stability at high temperature. Also, it presents a coefficient of thermal expansion that is close to that of a superalloy, and thermal conductivity that is compatible with that of the ceramic forming the first layer 22.

In general manner, stoechiometric anorthite comprises by weight: 20.16% calcium monoxide (CaO), 36.66% alumina ($Al_2O_3$), and 43.19% silica ($SiO_2$). This composition is advantageous for the following reasons.

In desert regions, calcium oxide is present at 15% by weight in sand, while silica is the main compound of that sand. When such sands are ingested by the turbine engine, the protective second layer 23 is chemically compatible with those compounds. This layer 23 comprising a majority by weight of anorthite thus conserves a crystal form and remains proof against CMAS.

In addition, it is known that aluminosilicate compounds can react with water, which may be present in the form of residual humidity when the turbine engine is stopped, or which may be generated by the fuel burning with air. Nevertheless, the decomposition reaction of anorthite with water is very slow in the operating conditions of a turbine engine. Likewise, other decomposition reactions of anorthite are known, but they present rates that are just as slow in the pressure and temperature conditions under consideration, so they are not pertinent to a turbine engine application.

A method of depositing a protective second layer 23 based on anorthite is described briefly below.

The method begins with synthesizing anorthite. Reagents such as kaolin (a source of silicon and aluminum), alumina or aluminum hydroxide (source of aluminum), and lime or calcium carbonate (source of calcium) are prepared. Table 1 below gives two examples (E1, E2) of quantities for each ingredient to be used in order to make about 90 grams (g) of anorthite (the yield obtained with the operating procedure described below is about 90%). In order to improve the yield, it is possible for example to add boric acid $H_3BO_3$ at 1% by weight.

TABLE 1

|  |  | E1 | E2 |
|---|---|---|---|
| Kaolin | $Al_2Si_2O_5(OH)_4$ | 80 g | 62 g |
| Lime | $Ca(OH)_2$ | 20 g |  |
| Calcium carbonate | $CaCO_3$ |  | 28 g |
| Aluminum hydroxide | $Al(OH)_3$ |  | 10 g |

The reagents in powder form are mixed in a grinder lubricated with distilled water. The mixture is then subjected to compression pressure by means of ceramic beads (e.g. made of zirconia) having the following significant parameters: pressure in the range 100 megapascals (MPa) to 150 MPa, speed of rotation lying in the range 100 revolutions per minute (rpm) to 500 rpm, and grinding for a period of time in the range 20 minutes (min) to 60 min. Naturally, these values are given by way of illustration.

Thereafter, the mixture that had been ground is dried in order to eliminate all residual moisture, in general at a temperature in the range 100° C. to 120° C.

Thereafter, the synthesis method is terminated by calcining the ground and dried mixture at a temperature lying in the range 900° C. to 1080° C. for a period of time lying in the range 1 hour (h) to 6 h. Cooling is then performed under dry air.

Finally, the anorthite as synthesized in this way can be deposited using various means known to the person skilled in the art such as: sol-gel, slurry, chemical vapor deposition, spraying, suspension plasma spraying (SPS), or solution precursor plasma spraying (SPPS), high velocity oxy-fuel (HVOF) type spraying, or indeed by electron beam physical vapor deposition (EB-PVD). For such deposition, the synthesized anorthite is preferably in the form of a powder having a mean grain size of a few micrometers. After the anorthite has been deposited, it is possible to perform heat treatment in order to finish off forming the protective coating on the substrate and to control the crystallinity of the protective second layer 23.

Figure 4:
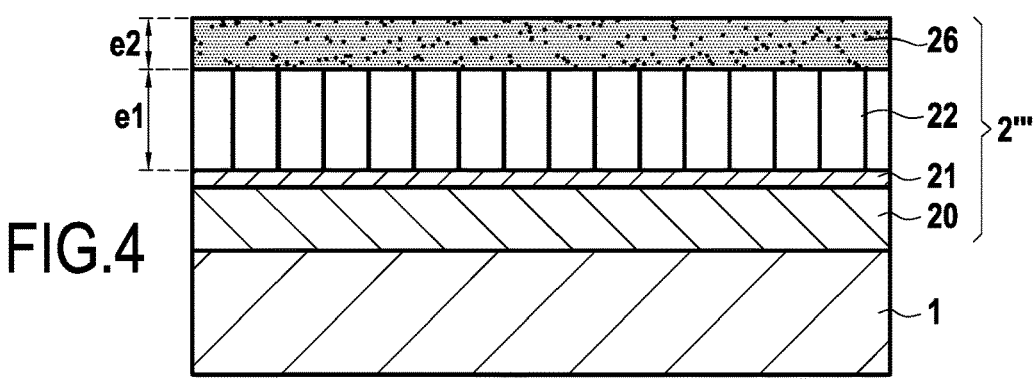

It should be observed that while depositing the anorthite powder in order to make the second layer 23 (FIGS. 1 and 2) or the third layer 24 (FIG. 3), it is possible to incorporate alumina and/or titanium oxide powder in the anorthite powder during deposition in order to form a multiphase fourth layer 26 (FIG. 4).

The invention claimed is:

1. A coated part comprising a metallic and/or intermetallic substrate and a protective coating forming a thermal barrier covering said substrate,
    wherein the protective coating comprises a ceramic first layer and wherein the protective coating further comprises a second layer present on the first layer, the second layer comprising a majority by weight of a first feldspar mineral having a melting temperature higher than or equal to 1010° C. and presenting a thickness greater than or equal to 10 µm, wherein the second layer presents a degree of crystallinity that is greater than or equal to 5%,
    and wherein the coating further comprises a third layer covering the second layer and comprising alumina and/or titanium oxide.

2. A part according to claim 1, wherein the second layer presents a thickness greater than or equal to 20 µm.

3. A part according to claim 1, wherein the ceramic first layer comprises zirconia.

4. A part according to claim 3, wherein the ceramic first layer comprises yttrium-stabilized zirconia.

5. A part according to claim 1, wherein the second layer comprises a majority by weight of anorthite.

6. A part according to claim 1, wherein the coating further comprises a fourth layer comprising a majority by weight of a second feldspar mineral having a melting temperature greater than or equal to 1010° C., the fourth layer being situated under the first layer.

7. A part according to claim 1, wherein the second layer further comprises alumina and/or titanium oxide.

8. A method of fabricating a coated part comprising a metallic and/or intermetallic substrate and a protective coating forming a thermal barrier covering said substrate, the method comprising
    forming a ceramic first layer on the metallic and/or intermetallic substrate,
    forming a second layer on the ceramic first layer, the second layer comprising a majority by weight of a feldspar mineral having a melting temperature higher than or equal to 1010° C. and presenting a thickness greater than or equal to 10 µm, wherein the second layer presents a degree of crystallinity that is greater than or equal to 5%, and
    forming a third layer covering the second layer and comprising alumina and/or titanium oxide.

9. A method of using a coated part according to claim 1, comprising using the part in an oxidizing environment at a temperature higher than 1000° C. and in the presence of aluminosilicates of calcium and of magnesium.

* * * * *